United States Patent
Fucili et al.

(10) Patent No.: US 10,483,213 B2
(45) Date of Patent: Nov. 19, 2019

(54) DIE IDENTIFICATION BY OPTICALLY READING SELECTIVELY BLOWABLE FUSE ELEMENTS

(71) Applicant: STMicroelectronics S.r.l., Agrate Brianza (IT)

(72) Inventors: Giona Fucili, Milan (IT); Agostino Mirabelli, Lornello (IT); Lorenzo Papillo, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/703,497

(22) Filed: Sep. 13, 2017

(65) Prior Publication Data

US 2019/0081004 A1 Mar. 14, 2019

(51) Int. Cl.

| | |
|---|---|
| *H01L 21/66* | (2006.01) |
| *H01L 23/544* | (2006.01) |
| *H01L 23/525* | (2006.01) |
| *H01L 21/67* | (2006.01) |
| *H01L 21/78* | (2006.01) |
| *G01R 31/317* | (2006.01) |
| *G11C 17/16* | (2006.01) |

(52) U.S. Cl.
CPC ...... *H01L 23/544* (2013.01); *G01R 31/31718* (2013.01); *H01L 21/67271* (2013.01); *H01L 21/78* (2013.01); *H01L 22/14* (2013.01); *H01L 22/34* (2013.01); *H01L 23/5256* (2013.01); *G11C 17/16* (2013.01); *G11C 17/165* (2013.01); *H01L 21/67294* (2013.01); *H01L 2223/5448* (2013.01); *H01L 2223/54413* (2013.01); *H01L 2223/54433* (2013.01); *H01L 2223/54473* (2013.01)

(58) Field of Classification Search
None
See application file for complete search history.

(56) References Cited

U.S. PATENT DOCUMENTS

| | | |
|---|---|---|
| 5,301,143 A | 4/1994 | Ohri et al. |
| 5,642,307 A | 6/1997 | Jernigan |
| 5,998,853 A | 12/1999 | Sugasawara |
| 8,013,422 B2 | 9/2011 | Pharn et al. |
| 8,881,246 B2 | 11/2014 | Huang et al. |

(Continued)

OTHER PUBLICATIONS

"Demultiplexer (DEMUX) Digital Decoder Tutorial" available at URL: https://www.electronics-tutorials.ws/combination/comb_3.html (Year: 2014).*

*Primary Examiner* — Erik Kielin
(74) *Attorney, Agent, or Firm* — Crowe & Dunlevy

(57) ABSTRACT

Many integrated circuit die are fabricated on a wafer. Each die includes integrated functional circuitry with an array of fuse elements that are visible to optical inspection. An electrical wafer sort is performed to test the integrated functional circuitry of each die. The array of fuse elements for each die on the wafer are programmed through the electrical wafer sort process with data bits defining a die identification that specifies a location of the die on the wafer. The die is then encapsulated in a package. In the event of package failure, a decapsulation is performed to access the die. Optical inspection of the array of fuse elements is then made to extract the die identification.

12 Claims, 4 Drawing Sheets

(56) References Cited

U.S. PATENT DOCUMENTS

2005/0275062 A1* 12/2005 Matsuda ............... H01L 23/544
                                                                                  257/532
2008/0024196 A1* 1/2008 Marshall ................ G11C 17/16
                                                                                   327/525

* cited by examiner

DIE IDENTIFICATION BY OPTICALLY READING SELECTIVELY BLOWABLE FUSE ELEMENTS

TECHNICAL FIELD

The present disclosure generally relates to the provision of manufacturing-related information on an integrated circuit die and, in particular, to the provision of optically readable manufacturing-related information programmed into a fuse array of the integrated circuit die.

BACKGROUND

Reference is made to FIG. 1 showing a top plan view of a semiconductor wafer 10 including a plurality of integrated circuit die 12 arranged in a matrix or array format. For tracking and quality control purposes, each wafer 10 is assigned a wafer identification (wafer_id) and that identification is typically etched into the top surface of the wafer at a location devoid of integrated circuit die 12 (for example, at or near a peripheral edge of the wafer). The wafer_id provides information specific to the wafer and/or the lot from which the wafer is obtained. For similar tracking and quality control purposes, each individual integrated circuit die 12 is also assigned a die identification (die_id). The die_id provides information specific to the integrated circuit die 12 such as its location (i.e., coordinates) within the matrix or array format of the wafer 10. It is also possible for the die_id to further include wafer identification information such that the die_id provides information as to both the identification of the wafer 10 and the location within that wafer 10 from which the integrated circuit die 12 was obtained.

The prior art teaches a number of ways for including the die_id within each integrated circuit die 12. For example, the die_id may be micro-etched in a layer of the integrated circuit die 12 (FIG. 2A) separate from any included integrated functional circuitry 16. Alternatively, the die_id may be stored in an electrically-readable non-volatile memory (NVM) circuit (FIG. 2B) within the integrated functional circuitry 16. A concern with prior art die identification techniques is that damage to the die may render the die_id unreadable. For example, in connection with the FIG. 2B implementation, damage to the die may damage the non-volatile memory circuit and/or related read circuitry making it impossible to recover the stored die_id.

SUMMARY

In an embodiment, a process comprises: fabricating a plurality of integrated circuit die on a wafer, each integrated circuit die including integrated functional circuitry; providing within each integrated functional circuitry an array of fuse elements, wherein said array of fuse elements is visible to optical inspection through a top surface of the integrated circuit die; performing an electrical wafer sort process on the wafer to test the integrated functional circuitry of each integrated circuit die; and accessing the array of fuse elements for each integrated circuit die on the wafer through the electrical wafer sort process to program individual fuses within the array of fuse elements with data bits defining a die identification that specifies a location of the integrated circuit die on the wafer.

In an embodiment, an integrated circuit die comprises: integrated functional circuitry; an array of fuse elements, wherein said array of fuse elements is visible to optical inspection through a top surface of the integrated circuit die; and a programming circuit configured to program individual fuse elements within the array of fuse elements with data bits defining a die identification that specifies a location of the integrated circuit die on a wafer from which the integrated circuit die was singulated.

In an embodiment, an integrated circuit package comprises: an integrated circuit die including integrated functional circuitry; a package block which encapsulates the integrated circuit die; an array of fuse elements supported within the integrated circuit die; and a programming circuit configured to program individual fuse elements within the array of fuse elements corresponding to data bits defining a die identification that specifies a location of the integrated circuit die on a wafer from which the integrated circuit die was singulated; wherein said array of fuse elements is visible so as to allow a determination of the data bits defining the die identification by optical inspection through a top surface of the integrated circuit die after at least a partial removal of the package block.

In an embodiment, a process comprises: receiving an integrated circuit package that includes an integrated circuit die having failed integrated functional circuitry, the integrated functional circuitry including an array of fuse elements programmed in accordance with data bits defining a die identification that specifies a location on a wafer where the integrated circuit die was fabricated; decapping the integrated circuit package to expose a top surface of the integrated circuit die; and visually examining the array of fuse elements through the top surface of the integrated circuit die to detect data bits of the die identification of the integrated circuit die from the programmed fuse elements within the array of fuse elements.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which.

Figure 4:
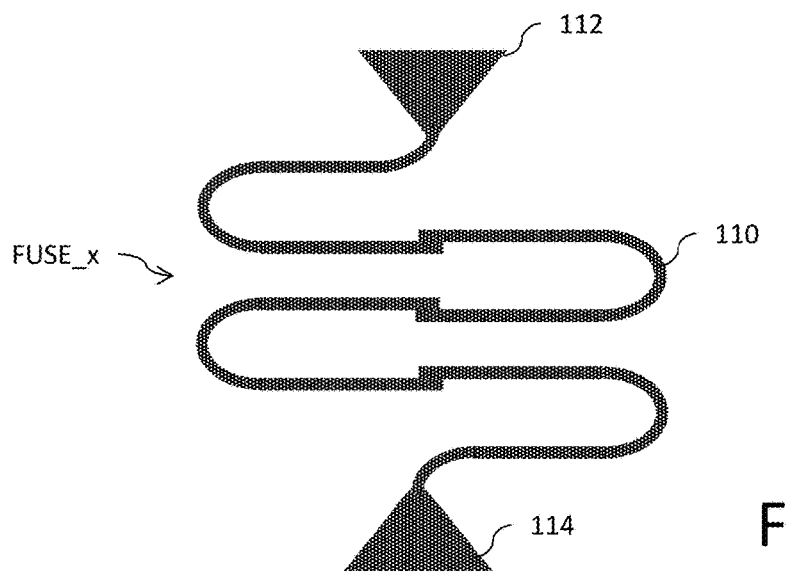
Figure 5:
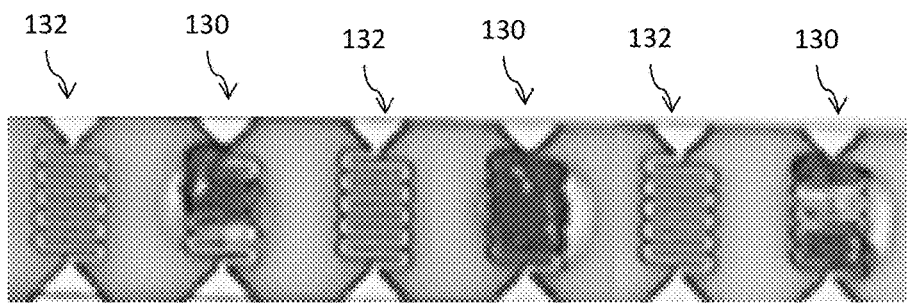
Figure 6:
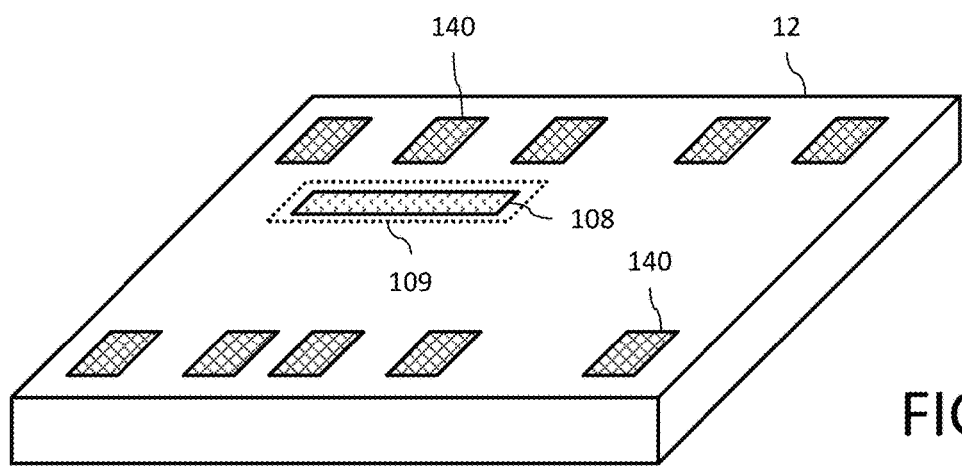
Figure 7:
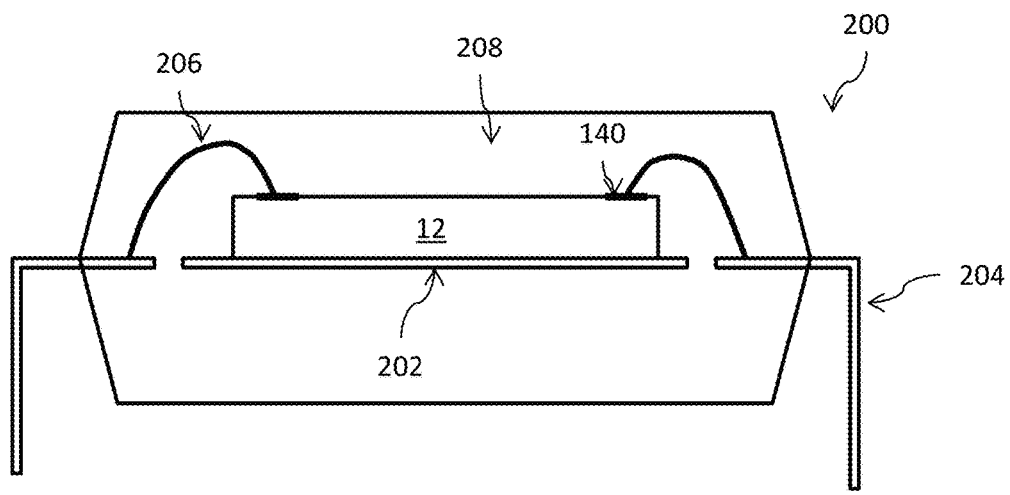

3A and 3B show circuit diagrams for an optically readable fuse memory circuit configured to store die information;

FIG. 4 illustrates a circuit layout for a fuse element;

FIG. 5 is a die photograph of optically readable fuse elements after programming;

FIG. 6 is a perspective view of the integrated circuit die;

FIG. 7 is a perspective view of an integrated circuit package; and

Figure 8:
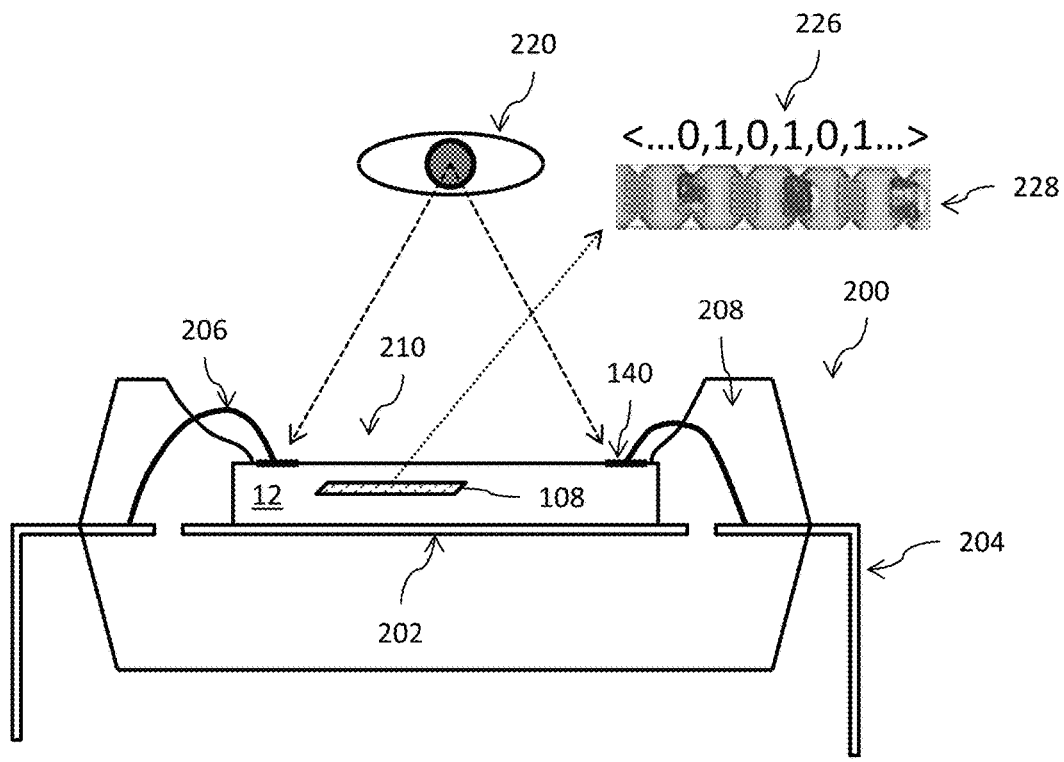

FIG. 8 show a partial decapping of the integrated circuit package for visual inspection.

DETAILED DESCRIPTION

Figure 1:
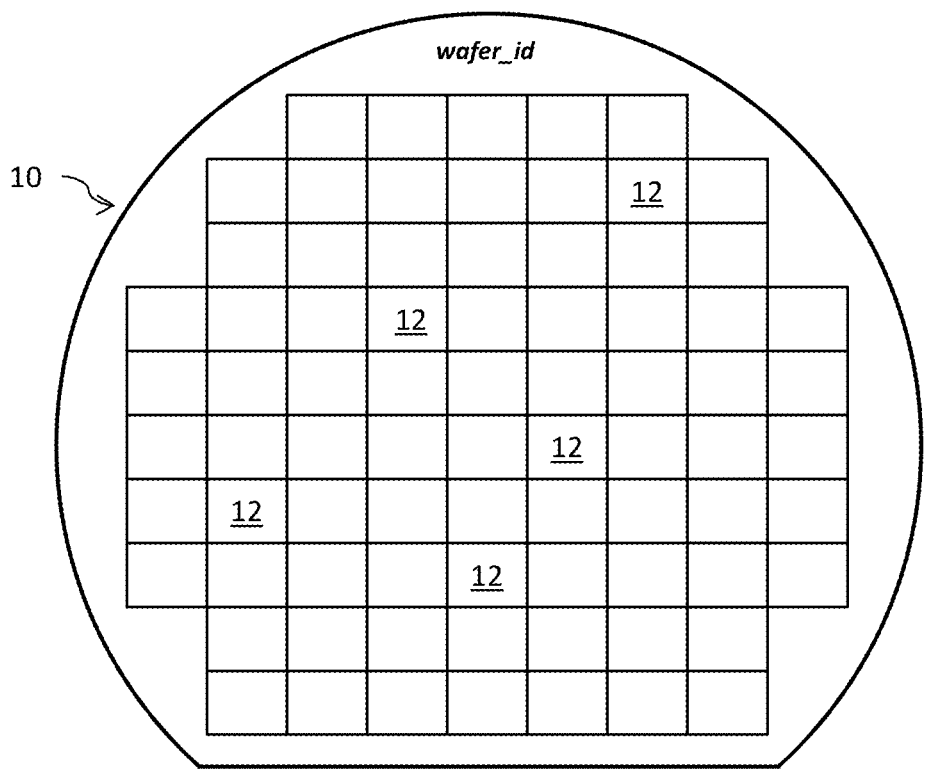
FIG. 1 shows a top plan view of a semiconductor wafer including a plurality of integrated die.
Figure 2A:
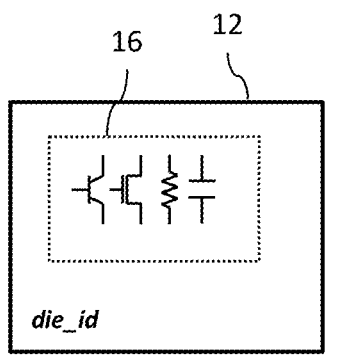
FIGS. 2A-2B show implementations for including a die identification within an integrated circuit die.
Figure 2B:
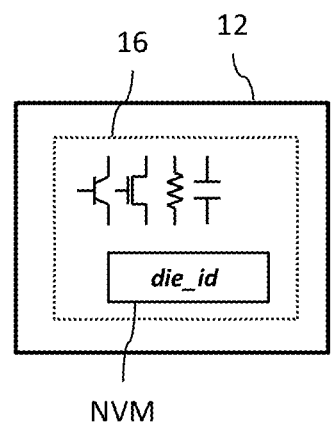
Figure 3A:
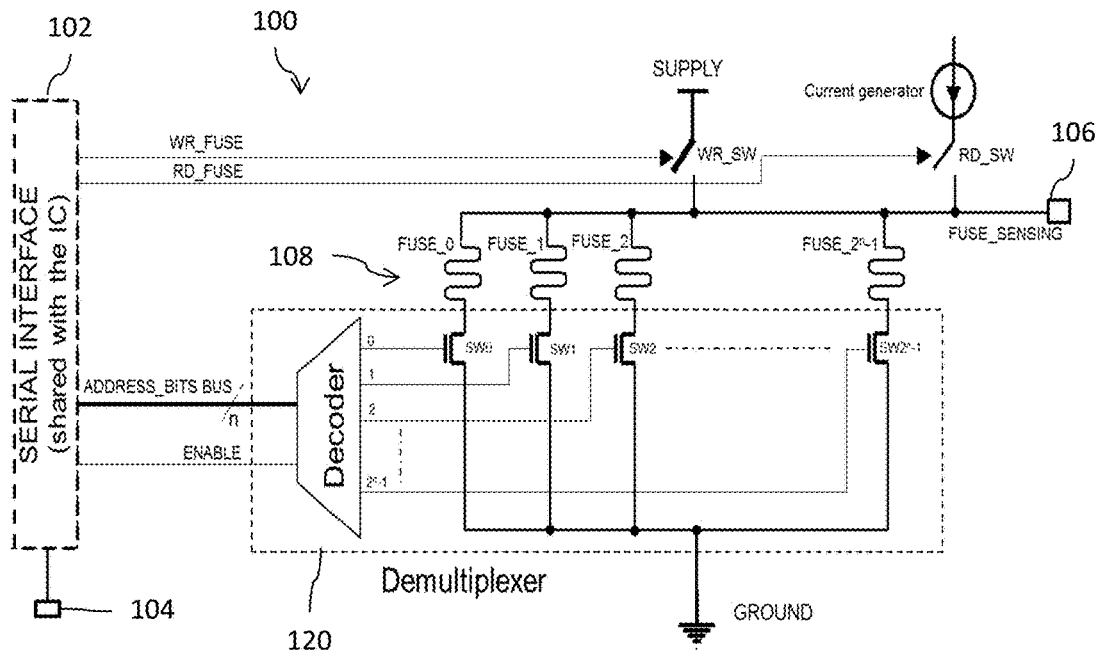
Figure 3B:
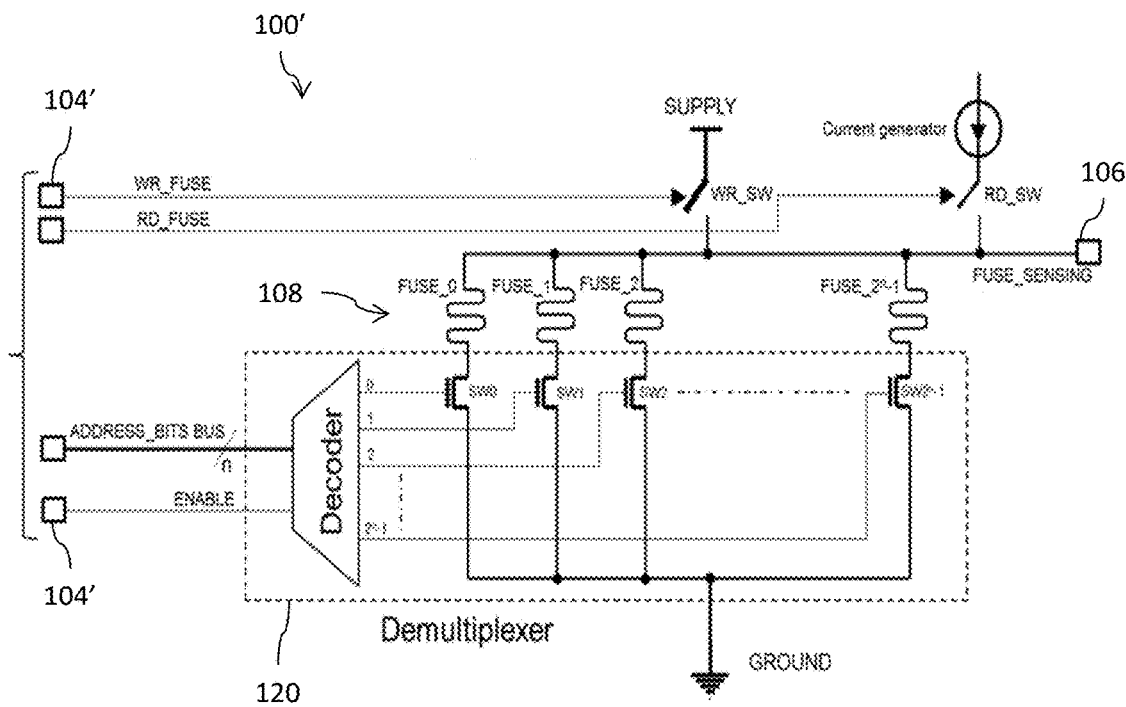

Reference is now made to FIGS. 3A and 3B which show circuit diagrams for an optically readable fuse memory circuit 100, 100' configured to store die information. The circuits 100 and 100' differ from each other in terms of how the control signaling (i.e., control signals WR_FUSE, RD_FUSE, ADDRESS_BITS, ENABLE) is generated. In circuit 100, the control signaling is generated by a serial interface circuit 102 that is coupled to a serial interface pad 104 of the integrated circuit die 12. The data of the control signaling is received in serial format over the pad 104 and converted to generate the various control signals. In the circuit 100', on the other hand, the individual pads 104' of the integrated circuit die 12 receive the various control signals.

The circuits 100, 100' include a fuse array 108 formed by a plurality of individual fuse elements FUSE_0 to FUSE_$2^{n-1}$. With reference to FIG. 4, each fuse element FUSE_x may be formed by a serpentine-shaped metal line 110 connected between a first fuse terminal 112 and a second fuse terminal 114. The first fuse terminals 112 of the fuses within the fuse array 108 are connected to a fuse sensing node (FUSE_SENSING). The second fuse terminals 114 of the fuses within the fuse array 108 are connected to a demultiplexer circuit 120. The fuse sensing node (FUSE_SENSING) is connected to a power supply node (SUPPLY) through a transistor switch (WR_SW). The transistor switch (WR_SW) is selectively actuated by the control signal WR_FUSE to apply a voltage to the fuse array 108 during a write (WR) operation to program the data for the die_id to the fuses within the fuse array 108. The fuse sensing node (FUSE_SENSING) is also connected to a current generator through a transistor switch (RD_SW). The transistor switch (RD_SW) is selectively actuated by the control signal RD_FUSE to apply a current to the fuse array 108 during a read (RD) operation to sense the data for the die_id that was programmed into the fuses within the fuse array 108.

The demultiplexer circuit 120 includes a decoder circuit having an address input coupled to an address bus to receive the control signal ADDRESS_BITS specifying a certain one of the $2^{n-1}$ fuses to be accessed. The decoder circuit is enabled for operation in response to the control signal ENABLE. The $2^{n-1}$ outputs of the decoder circuit are connected to the control gates of transistor switches SW0 to SW$2^{n-1}$. Each transistor switch is an n-channel MOSFET device having a source terminal connected to ground and a drain terminal connected to the second fuse terminal 114 of one of the fuses within the fuse array 108.

In write mode, when writing the bits of the die_id to the fuses of the fuse array 108, the control signal WR_FUSE is asserted. The ADDRESS_BITS specifying a certain one of the $2^{n-1}$ fuses to be blown are applied to the address bus and the control signal ENABLE is then asserted. Current flows through the FUSE_x selected by the ADDRESS_BITS and the serpentine-shaped metal line 110 melts. This process is repeated for each fuse that needs to be blown in order to program a certain logic state of the bits of the die_id in the fuse array 108. As an example, assume that the die_id is <01001 . . . 1> and further assume that a blown fuse indicates a logic 1 value. The ADDRESS_BITS would specify the x=1, x=4, . . . , x=$2^{n-1}$ ones of the fuses FUSE_x to be blown.

The process for writing the bits of the die_id to the fuses of the fuse array 108 is performed during the electrical wafer sort (EWS) process. Electrical wafer sort is a testing process performed on the wafer 10 to test operation of the included integrated circuit die 12. A probe card coupled to automated test equipment (ATE) makes electrical connection to pads of each integrated circuit die 12 and executes a series of electrical tests. If the integrated circuit die 12 passes those tests, it is approved for further manufacturing processing such as encapsulation within an integrated circuit package.

While the probe card is in contact with the integrated circuit die 12, the automated test equipment can be used to operate the circuits 100, 100' (through connection to pads 104, 104) to program the die_id data bits into the fuse array 108. The wafer 10 is then diced to separate (i.e., singulate) the integrated circuit die 12 from the wafer. Integrated circuit die that pass testing in the EWS process are passed on for further manufacturing processing. Integrated circuit die 12 that fail testing in the EWS process are segregated out to be discarded and, if needed, subjected to a debug examination to determine why testing was failed.

In read mode, when reading the bits of the die_id from the fuses of the fuse array 108, the control signal RD_FUSE is asserted. The ADDRESS_BITS for each FUSE_x of the fuse array 108 are sequentially generated along with assertion of the control signal ENABLE. The voltage at the fuse sensing node (FUSE_SENSING) is then detected for each applied address to determine the programmed state (blown/not blown) of each FUSE_x. The sensed voltage may be detected, for example, at a pin 106 of the integrated circuit 12. Electrical sensing of the programmed state of each FUSE_x is typically performed during a debug examination of the integrated circuit. Such electrical sensing may also be performed in connection with the EWS process to confirm accurate programming of the die_id information.

FIG. 5 is a photograph of a portion of the integrated circuit 12 showing six fuses within the fuse array 108 after programming. The distinction between blown fuses 130 and not blown fuses 132 is clearly visible and may be easily observed using imaging equipment such as a camera or a microscope. Although only six fuses are shown in FIG. 5, it will be understood that the fuse array 108 will include many more fuses. In an embodiment, 32 fuses are provided in the fuse array (i.e., n=5).

The fuse array 108 is arranged in a region 109 of the integrated circuit die 12 where it is visible to inspection. In other words, the region 109 of the integrated circuit die 12 does not include overlying circuits or structures (i.e., metal lines, vias, bonding pads, capacitor plates, inductor windings, etc.) which would obstruct an optical viewing of the fuse array 108 and evaluation of the blown/not blow fuse status. This is generally illustrated in FIG. 6 which shows a perspective view of an integrated circuit die 12 showing the bonding pads 140 located about the periphery of the integrated circuit die, but without any obstruction by those bonding pads, 140 (or other circuits and structures—not explicitly shown) preventing visual observation of the fuse array 108 in the region 109.

A cross-section of a package 200 including the integrated circuit die 12 is shown in FIG. 7. The integrated circuit die 12 is mounted to a die pad 202 with the bonding pads 140 of the integrated circuit die 12 electrically connected to package leads 204 by bonding wires 206. The assembly is encapsulated within a package block 208 with the package leads 204 extending from the package block.

It is recognized that integrated circuit devices may fail long after leaving the factory. In such cases, the failed integrated circuit device may be returned to the manufacturer for post-mortem analysis to determine the cause of the failure. To perform the post-mortem analysis, at least a portion 210 of the package block 208 is removed to expose the top surface of the integrated circuit die 12. This process is commonly referred to in the art as "decapping" (or decapsulating). With the top surface of the integrated circuit die 12 now exposed, a visual inspection (reference 220) can be made of the integrated circuit die 12. As noted above, the fuse array 108 is arranged in a region 109 of the integrated circuit die 12 where it is visible to inspection through the top surface of the die and without further processing of the die such as layer removal. An advantage of the implementation for die identification disclosed herein is that the blown fuses 130 and not blown fuses 132 of the fuse array 108 are clearly visible (FIG. 5) through the top surface of the integrated circuit die 12 using imaging equipment such as a camera or a microscope to perform the visible inspection. The bits of the die_id (reference 226) may then be recovered from the integrated circuit die 12 from the blown/not blown fuse markings within the image 228 of the fuse array even if the damaged electronic circuits of the integrated circuit die 12 would otherwise preclude a circuit reading of the fuse array 108 (for example, using the demultiplexer circuit 120, fuse sensing node (FUSE_SENSING) and pin 106). From the bits of the die_id optically read from the image 228 of the visible fuse array 108, the integrated circuit die 12 may be traced back to the location within the wafer 10 where the integrated circuit die 12 was manufactured as well as the specific wafer 10 from which that integrated circuit die 12 was obtained.

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An integrated circuit, comprising:
   integrated functional circuitry;
   an array of fuse elements, each fuse element having a first terminal and a second terminal, wherein the first terminals are directly connected to a fuse sensing node;
   a first switch actuated by a first control signal to apply a programming voltage to the fuse sensing node;
   a second switch actuated by a second control signal to apply a reading current to the fuse sensing node; and
   a demultiplexing circuit comprising:
      a switching circuit connected in series with each fuse element within the array of fuse elements at the second terminal; and
      a decoder circuit configured to:
         selectively actuate the switching circuits in a first mode when the first control signal actuates the first switch and the second switch is deactuated so as to cause the programming voltage to be applied at the fuse sensing node and across selected ones of the fuse elements within the array of fuse elements which is sufficient to blow the selected fuse element so as to program individual fuse elements within the array of fuse elements with data bits defining a die identification that specifies a location of the integrated circuit die on a wafer from which the integrated circuit die was singulated; and
         selectively actuate the switching circuits in a second mode when the second control signal actuates the second switch and the first switch is deactuated so as to cause the reading current to be applied at the fuse sensing node and across the fuse elements within the array of fuse elements to generate an output signal at the fuse sensing node indicating whether the fuse element is blown so as to read the data bits defining the die identification.

2. The integrated circuit of claim 1, wherein the array of fuse elements is located within a region of the integrated circuit die that is not visually obscured from the top surface of the integrated circuit die by any of the following structures: metal lines, vias, bonding pads, capacitor plates, inductor windings.

3. The integrated circuit of claim 1, wherein the demultiplexer circuit is controlled by a signal received from automated test equipment (ATE) in connection with electrical wafer sort (EWS) processing of the integrated circuit die to selectively blow individual fuse elements within the array of fuse elements to program the data bits defining the die identification.

4. The integrated circuit of claim 1, wherein the decoder circuit receives address bits and decodes the received address bits to selectively actuate the switching circuits.

5. The integrated circuit of claim 4, wherein the address bits are applied to pins of the integrated circuit die.

6. The integrated circuit of claim 4, wherein the address bits are serially applied to a pin of the integrated circuit die, further comprises a serial interface configured to serially receive the address bits and output the address bits to the decoder circuit.

7. An integrated circuit, comprising:
   integrated functional circuitry;
   an array of fuse elements, each fuse element having a first terminal and a second terminal, wherein the first terminals are directly connected to a common node;
   a first switch actuated by a first control signal to apply a programming voltage to the fuse sensing node;
   a second switch actuated by a second control signal to apply a reading current to the fuse sensing node; and
   a demultiplexing circuit comprising:
      a switching circuit connected in series with each fuse element within the array of fuse elements at the second terminal; and
      a decoder circuit configured to:
         selectively actuate the switching circuits in a first mode when the first control signal actuates the first switch and the second switch is deactuated so as to cause the programming voltage to be applied at the fuse sensing node and across selected ones of the fuse elements within the array of fuse elements which is sufficient to blow the selected fuse element so as to program individual fuse elements within the array of fuse elements with data bits; and
         selectively actuate the switching circuits in a second mode when the second control signal actuates the second switch and the first switch is deactuated so as to cause the reading current to be applied at the fuse sensing node and across the fuse elements within the array of fuse elements to generate an output signal at the common node indicating whether the fuse element is blown so as to read the data bits.

8. The integrated circuit of claim 7, wherein the array of fuse elements is located within a region of the integrated circuit die that is not visually obscured from the top surface of the integrated circuit die by any of the following structures: metal lines, vias, bonding pads, capacitor plates, inductor windings.

9. The integrated circuit of claim 7, wherein the demultiplexer circuit is controlled by a signal received from automated test equipment (ATE) in connection with electrical wafer sort (EWS) processing of the integrated circuit die to selectively blow individual fuse elements within the array of fuse elements to program the data bits defining the die identification.

10. The integrated circuit of claim 7, wherein the decoder circuit receives address bits and decodes the received address bits to selectively actuate the switching circuits.

11. The integrated circuit of claim 10, wherein the address bits are applied to pins of the integrated circuit die.

12. The integrated circuit of claim 10, wherein the address bits are serially applied to a pin of the integrated circuit die, further comprises a serial interface configured to serially receive the address bits and output the address bits to the decoder circuit.

* * * * *